US012813025B2

(12) United States Patent
Momose

(10) Patent No.: US 12,813,025 B2
(45) Date of Patent: Nov. 24, 2026

(54) SEMICONDUCTOR LIGHT-EMITTING DEVICE, SEMICONDUCTOR LIGHT-EMITTING DEVICE CONNECTING STRUCTURE, AND METHOD OF PRODUCING SEMICONDUCTOR LIGHT-EMITTING DEVICE

(71) Applicant: DOWA Electronics Materials Co., Ltd., Tokyo (JP)

(72) Inventor: Takashi Momose, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 433 days.

(21) Appl. No.: 18/249,258

(22) PCT Filed: May 18, 2021

(86) PCT No.: PCT/JP2021/018867

§ 371 (c)(1),
(2) Date: Apr. 17, 2023

(87) PCT Pub. No.: WO2022/085231

PCT Pub. Date: Apr. 28, 2022

(65) Prior Publication Data

US 2024/0030386 A1 Jan. 25, 2024

(30) Foreign Application Priority Data

Oct. 20, 2020 (JP) ................................ 2020-176269

(51) Int. Cl.
*H01L 33/40* (2010.01)
*H10H 20/01* (2025.01)
(Continued)

(52) U.S. Cl.
CPC .... *H10H 20/832* (2025.01); *H10H 20/01335* (2025.01); *H10H 20/825* (2025.01); *H10H 20/032* (2025.01)

(58) Field of Classification Search
CPC ........... H10H 20/832; H10H 20/01335; H10H 20/825; H10H 20/032; H10H 20/831; H10D 64/20; H10D 64/60
See application file for complete search history.

(56) References Cited

U.S. PATENT DOCUMENTS 6,067,309 A * 5/2000 Onomura .............. H01S 5/0421 372/45.01
6,331,450 B1 * 12/2001 Uemura ................. H10H 20/01 257/E33.059
(Continued)

FOREIGN PATENT DOCUMENTS

CN 105552191 A 5/2016
JP 2005210051 A 8/2005
(Continued)

OTHER PUBLICATIONS

Dobos et al., "The microstructure of Ti/Au contacts on n-type GaN annealed in nitrogen," Microelectronic Engineering 90 (2012) pp. 118-120.*
(Continued)

*Primary Examiner* — Jay C Kim
(74) *Attorney, Agent, or Firm* — KENJA IP LAW PC

(57) ABSTRACT

Provided is a semiconductor light-emitting device for which detrimental effects such as discoloration of an electrode or emission failure due to migration are suppressed even when a joint material containing Ag is used, and a method of producing the same. The semiconductor light-emitting device includes a p-type semiconductor layer, a p-type electrode provided on the p-type semiconductor layer, and a pad provided on the p-type electrode. The p-type electrode
(Continued)

at least has an ohmic metal layer placed on the p-type semiconductor layer side and a barrier layer that is placed closer to the pad than the ohmic metal layer and includes a TiN layer. In a top view, when a region of the barrier layer that does not overlap an electrical connection region between the pad and the barrier layer is defined as a surface diffusion inhibiting surface, the surface diffusion inhibiting surface is formed in a circular pattern.

19 Claims, 7 Drawing Sheets

(51) Int. Cl.
*H10H 20/825* (2025.01)
*H10H 20/832* (2025.01)

(56) References Cited

U.S. PATENT DOCUMENTS

| | | | | |
|---|---|---|---|---|
| 6,740,906 | B2 * | 5/2004 | Slater, Jr. | H10H 20/819 257/E33.068 |
| 7,183,586 | B2 * | 2/2007 | Ichihara | H10H 20/825 257/E33.068 |
| 7,683,386 | B2 * | 3/2010 | Tanaka | H01L 21/0254 257/E21.119 |
| 8,115,212 | B2 * | 2/2012 | Miki | H10H 20/835 257/79 |
| 8,445,916 | B2 * | 5/2013 | Kojima | H10H 20/832 438/33 |
| 8,497,518 | B2 * | 7/2013 | Li | H10H 20/018 257/94 |
| 8,552,447 | B2 * | 10/2013 | Yahata | H10H 20/833 257/85 |
| 8,643,046 | B2 * | 2/2014 | Okabe | H10H 20/831 257/98 |
| 8,829,555 | B2 * | 9/2014 | Kamei | H10H 20/833 257/E33.064 |
| 8,921,885 | B2 * | 12/2014 | Lee | H10H 20/835 257/79 |
| 8,936,950 | B2 * | 1/2015 | Nakajo | H10H 20/833 438/22 |
| 9,343,617 | B2 * | 5/2016 | Sumitomo | H10H 20/0137 |
| 9,773,948 | B2 * | 9/2017 | Jung | H10H 20/831 |
| 9,899,581 | B2 * | 2/2018 | Choi | H10H 20/831 |
| 9,997,672 | B2 * | 6/2018 | Hsu | H10H 20/832 |
| 10,535,798 | B2 * | 1/2020 | Jeon | H10H 20/8316 |
| 10,580,929 | B2 * | 3/2020 | Won Cheol | H10H 20/0137 |
| 10,615,311 | B2 * | 4/2020 | Park | H10H 20/8314 |
| 10,658,543 | B2 * | 5/2020 | Tasaki | H10F 30/20 |
| 10,777,764 | B2 * | 9/2020 | Renn | H10H 20/822 |
| 10,804,435 | B2 * | 10/2020 | Hisao | H10H 20/825 |
| 11,189,755 | B2 * | 11/2021 | Jang | H10H 20/814 |
| 11,462,663 | B2 * | 10/2022 | Kim | H10H 20/841 |
| 2008/0185609 | A1 | 8/2008 | Kozawa et al. | |
| 2012/0032213 | A1 * | 2/2012 | Sato | H10H 20/824 257/E33.072 |
| 2012/0043575 | A1 * | 2/2012 | Kim | H10H 20/841 257/E33.072 |
| 2012/0086037 | A1 * | 4/2012 | Kim | H10H 20/835 257/E33.072 |
| 2015/0060924 | A1 * | 3/2015 | Lin | H10H 20/814 257/98 |
| 2015/0236215 | A1 * | 8/2015 | Park | H10H 20/8316 257/98 |
| 2016/0111602 | A1 | 4/2016 | Hsu et al. | |
| 2016/0268478 | A1 * | 9/2016 | Tomizawa | H10H 20/8312 |
| 2017/0084788 | A1 * | 3/2017 | Sugiyama | H10H 20/01 |
| 2018/0062047 | A1 * | 3/2018 | Biwa | H10H 20/831 |
| 2018/0182921 | A1 * | 6/2018 | Jang | H10H 20/831 |
| 2020/0044116 | A1 | 2/2020 | Chen et al. | |
| 2021/0135058 | A1 * | 5/2021 | Niwa | H10H 20/84 |

FOREIGN PATENT DOCUMENTS

| | | | |
|---|---|---|---|
| JP | 2006041403 | A | 2/2006 |
| JP | 2008192782 | A | 8/2008 |
| JP | 2012142401 | A | 7/2012 |
| JP | 2013115341 | A | 6/2013 |
| JP | 2014135433 | A | 7/2014 |
| JP | 2014207327 | A | 10/2014 |
| JP | 2014241401 | A | 12/2014 |
| JP | 2015035510 | A | 2/2015 |
| JP | 2017108005 | A | 6/2017 |
| JP | 2020145316 | A | 9/2020 |
| KR | 1020160094922 | A | 8/2016 |
| TW | 201709419 | A | 3/2017 |
| WO | 2012026068 | A1 | 3/2012 |
| WO | 2014109137 | A1 | 7/2014 |

OTHER PUBLICATIONS

Aug. 24, 2022, Office Action issued by the Taiwan Intellectual Property Office in the corresponding Taiwanese Patent Application No. 110120858.

Aug. 3, 2021, International Search Report issued in the International Patent Application No. PCT/JP2021/018867.

Dec. 22, 2020, Notification of Reasons for Refusal issued by the Japan Patent Office in the corresponding Japanese Patent Application No. 2020-176269.

Feb. 17, 2023, Office Action issued by the Taiwan Intellectual Property Office in the corresponding Taiwanese Patent Application No. 110120858.

Mar. 9, 2021, Notification of Reasons for Refusal issued by the Japan Patent Office in the corresponding Japanese Patent Application No. 2020-176269.

Nov. 7, 2024, Office Action issued by the German Patent and Trade Mark Office Office in the corresponding German Patent Application No. 112021005518.6.

Apr. 13, 2023, International Preliminary Report on Patentability issued in the International Patent Application No. PCT/JP2021/018867.

Sep. 20, 2023, Office Action issued by the Taiwan Intellectual Property Office in the corresponding Taiwanese Patent Application No. 110120858.

Jan. 1, 2025, Office Action issued by the Korean Intellectual Property Office in the corresponding Korean Patent Application No. 10-2023-7012965.

* cited by examiner

FIG. 8

| | Electrical characteristics | | Appearance after heating | | State after heating | |
|---|---|---|---|---|---|---|
| | Vf(V) | Po(mA) | OM | Photograph of emission | Appearance | State of emission |
| Example 1 | 4.8 | 62.7 | 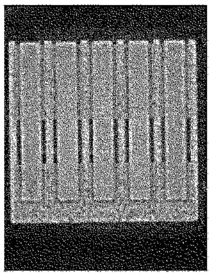 | 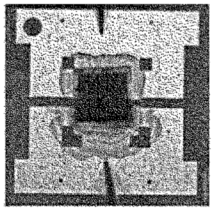 | No change observed | No change observed |
| Example 2 | 4.9 | 71.7 | 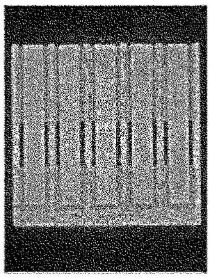 | 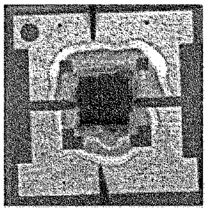 | No change observed | No change observed |
| Comparative Example 1 | 5.4 | 72.1 | 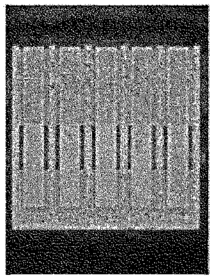 | 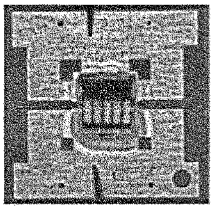 | Discolored part found in entire surface on p-pad side | No emission observed in the discolored part |
| Comparative Example 2 | 5.1 | 73.5 | 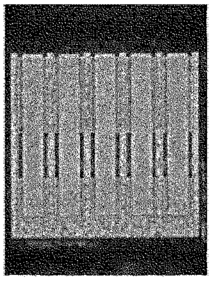 | 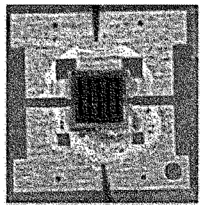 | No change observed | No emission observed in entire surface |

SEMICONDUCTOR LIGHT-EMITTING DEVICE, SEMICONDUCTOR LIGHT-EMITTING DEVICE CONNECTING STRUCTURE, AND METHOD OF PRODUCING SEMICONDUCTOR LIGHT-EMITTING DEVICE

TECHNICAL FIELD

The present disclosure relates to a semiconductor light-emitting device, a semiconductor light-emitting device connecting structure, and a method of producing a semiconductor light-emitting device.

BACKGROUND

In recent years, for joints in mounting semiconductor light-emitting devices on electronic substrates of devices, instead of Au (gold) bumps or Au—Sn (tin)-based solder; joint materials containing Ag (silver), for example, Sn—Ag—Cu (copper)-based solder (SAC), or pasty joint materials containing Ag have come to be commonly used. However, when semiconductor light-emitting devices are joined using a joint material containing Ag, Ag would erode electrodes due to migration, which would impair the reliability (for example, see JP 2013-115341 A (PTL 1)). While Ag is highly electrically conductive, Ag ions easily migrate (migration) (see PTL 1). Ag migration easily occurs particularly when an electric current flows or when the temperature changes. When the migration of Ag ions occurs, the characteristics and the reliability of semiconductor light-emitting devices are affected, for example, leakage occurs.

PTL 1 discloses a semiconductor device configured to include a reflective electrode containing Ag. This semiconductor device is described to be configured to include a layered structure of an oxide transparent conductive layer of ITO (indium tin oxide) or the like and a metal layer of TiW (tungsten titanium), Ti (titanium), Pt (platinum), TiN (titanium nitride), or the like to inhibit the migration of Ag.

CITATION LIST

Patent Literature

PTL 1: JP 2013-115341 A

SUMMARY

Technical Problem

Conventional techniques still cannot suppress detrimental effects such as discoloration of an electrode or emission failure due to the migration of Ag. In AlGaN (aluminum gallium nitride)-based semiconductor light-emitting devices, in particular, those detrimental effects on a p-type electrode having a relatively larger area than an n-type electrode have not been sufficiently suppressed. This being the case, there is a demand for a p-type electrode for which detrimental effects such as discoloration of the electrode or emission failure due to migration can be suppressed even when a joint material containing Ag is used.

It could therefore be helpful to provide a semiconductor light-emitting diode, a semiconductor light-emitting device connecting structure, and a method of producing a semiconductor light-emitting device for which detrimental effects such as discoloration of an electrode or emission failure due to migration are suppressed when a joint material containing Ag is used.

Solution to Problem

A semiconductor light-emitting device of this disclosure, intended for achieving the above objectives includes:

a p-type AlGaN-based semiconductor layer;

a p-type electrode provided on the p-type AlGaN-based semiconductor layer; and a pad provided on the p-type electrode.

The p-type electrode includes:

an ohmic metal layer placed on the p-type AlGaN-based semiconductor layer side; and a barrier layer that is placed closer to the pad than the ohmic metal layer and contains a TiN layer, and when a region of the barrier layer that does not overlap an electrical connection region between the pad and the barrier layer in a top view is defined as a surface diffusion inhibiting surface, the surface diffusion inhibiting surface is formed in a circular pattern.

In another aspect of the semiconductor light-emitting device according to this disclosure, the ohmic metal layer may be a layer free of Ag.

In another aspect of the semiconductor light-emitting device according to this disclosure, in a top view, a region of the barrier layer may be completely overlapped with or may be included in a region of the ohmic metal layer.

In another aspect of the semiconductor light-emitting device according to this disclosure, the thickness of a TiN layer included in the barrier layer may be 100 nm or more and 2000 nm or less.

In another aspect of the semiconductor light-emitting device according to this disclosure, the barrier layer may further have a Ti layer, and the Ti layer may be exposed in the surface diffusion inhibiting surface.

The semiconductor light-emitting device according to this disclosure may further include a Pt-containing layer placed between the barrier layer and the pad.

The pad and the barrier layer may be electrically connected via the Pt-containing layer, and in a top view, a region of the Pt-containing layer may be surrounded by the surface diffusion inhibiting surface.

In another aspect of the semiconductor light-emitting device according to this disclosure, the ohmic metal layer may contain Ni and Au.

In another aspect of the semiconductor light-emitting device according to this disclosure, in a top view, a shortest distance between an outer periphery of the connection region and an outer periphery of the region of the barrier layer may be 3 μm to 50 μm.

In another aspect of the semiconductor light-emitting device according to this disclosure, the barrier layer may inhibit migration of Ag from the pad into the p-type AlGaN-based semiconductor layer.

A semiconductor light-emitting device connecting structure intended for achieving the above objectives includes a joint material containing Ag and the above semiconductor light-emitting device.

The joint material is formed on the pad of the semiconductor light-emitting device.

A method of producing a semiconductor light-emitting device, intended for achieving the above objectives includes:

- a p-type electrode formation step of forming a p-type electrode on a p-type AlGaN-based semiconductor layer; and
- a pad formation step of forming a pad on the p-type electrode.

The p-type electrode formation step includes:

- an ohmic metal layer formation step of forming an ohmic metal layer on the p-type AlGaN-based semiconductor layer side; and
- a barrier layer formation step of forming a barrier layer including a TiN layer closer to the pad than the ohmic metal layer, and
- in a top view, when a region of the barrier layer that is not overlapped with an electrical connection region between the pad and the barrier layer in a top view is defined as a surface diffusion inhibiting surface, the pad is formed such that the surface diffusion inhibiting surface is formed in a circular pattern in the pad formation step.

In another aspect of the method of producing a semiconductor light-emitting device, according to this disclosure, an ohmic metal layer free of Ag may be formed in the ohmic metal layer formation step.

In another aspect of the method of producing a semiconductor light-emitting device, according to this disclosure, a region of the barrier layer may be completely overlapped with or may be included in the region of the ohmic metal layer in a top view in the barrier layer formation step.

In another aspect of the method of producing a semiconductor light-emitting device, according to this disclosure, the barrier layer formation step may include forming the barrier layer including the TiN layer and a Ti layer, and exposing the Ti layer in the surface diffusion inhibiting surface.

Advantageous Effect

This disclosure can provide a semiconductor light-emitting device, a semiconductor light-emitting device connecting structure, and a method of producing a semiconductor light-emitting device for which detrimental effects such as discoloration of an electrode or emission failure due to migration are suppressed even when a joint material containing Ag is used.

BRIEF DESCRIPTION OF THE DRAWINGS

In the accompanying drawings:

FIG. 8 is a diagram illustrating the evaluation results for semiconductor light-emitting devices according to Examples and Comparative Examples.

DETAILED DESCRIPTION

Figure 1:
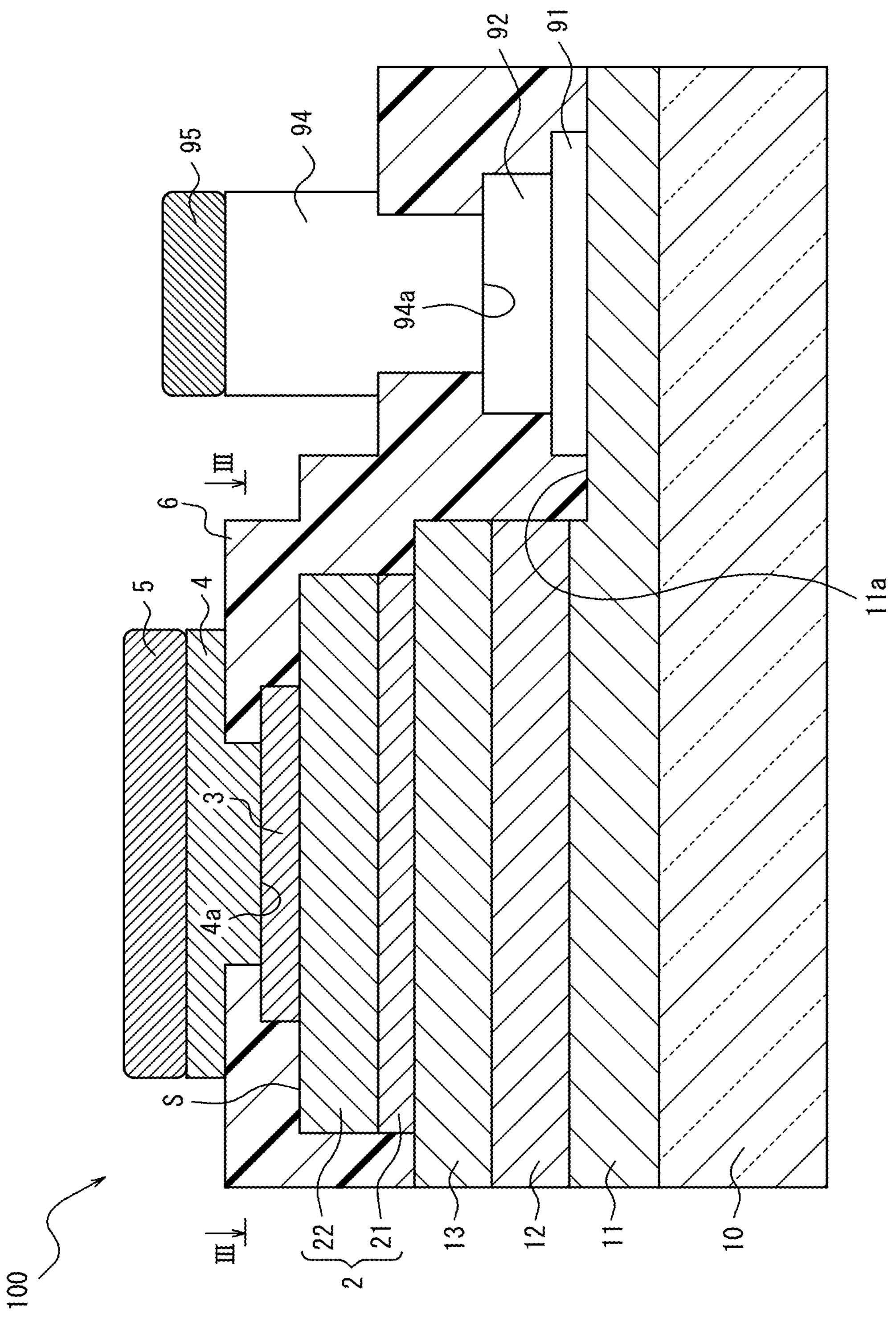
FIG. 1 is a cross-sectional view illustrating a schematic structure of a light-emitting device and a semiconductor light-emitting device connecting structure according to Embodiment 1.

Prior to describing embodiments of this disclosure, the following points are described beforehand. First, the term “AlGaN” alone for which the Al composition ratio is not specified means a given compound that has a composition ratio of group III elements (Al (aluminum) and Ga (gallium) in total) with respect to N of 1:1 and has any given ratio between the group III elements of Al and Ga. Even when no reference is made to In (indium) that is a group III element, In may be contained at 5% or less with respect to the total of the III elements of Al and Ga. When In is included, the composition formula is expressed as $Al_{x0}In_{y0}Ga_{1-x0-y0}N$, where the Al composition is $x_0$ and the In composition is $y_0$ ($0 \leq y_0 \leq 0.05$). Compositions simply referred to as “AlN (aluminum nitride)” and “GaN (gallium nitride)” mean that Al does not contain Ga and AaN does not contain Al, respectively; however, unless otherwise specified, a composition simply referred to as “AlGaN” does not exclude cases where the composition is one of AlN and GaN. Note that the values of the Al composition ratios can be found for example by photoluminescence spectroscopy or X-ray diffractometry.

In this specification, a layer serving as an electrically p-type layer is referred to as a p-type layer, and a layer serving as an electrically n-type layer is referred to as an n-type layer. On the other hand, a layer that is not deliberately doped with certain impurities such as Mg (magnesium) and Si (silicon) and does not serve as an electrically p-type or n-type layer is referred to as an “i-type” layer or an “undoped” layer. An undoped layer may contain impurities that are inevitably mixed in the production process. Specifically, when the carrier density is low (for example, less than $4\times10^{16}/cm^3$ atoms/$cm^3$), the layer is referred to as an “undoped” layer in this specification. Further, the values of the impurity concentrations of Mg, Si, and others are determined by SIMS analysis.

The total thickness of the layers can be measured using a thickness measurement system using optical interferometry. Further, when the composition ratios for the adjacent layers are sufficiently different (for example, the Al compositions differ by 0.01 or more), the thickness of each layer can be calculated by observing a cross section of the grown layers under a transmission electron microscope (TEM). For two of the adjacent layers that have the same or substantially the same Al composition (for example, the difference is less than 0.01) but have different impurity concentrations, the boundary between and the thickness of such two adjacent layers are found based on TEM-EDS data. The impurity concentrations of such two layers can be measured by SIMS analysis. Further, when the thickness of each layer is small as in a superlattice structure, the thickness can be measured by TEM-EDS.

Embodiments of this disclosure will now be described with reference to the drawings. In principle, like components are denoted by like reference numerals, and the description will not be repeated. Further, a substrate and layers in each drawing are exaggerated in thickness for convenience of illustration, so that the ratio between the vertical and horizontal dimensions of each illustrated component does not conform to the actual ratio.

A semiconductor light-emitting device according to the embodiments includes a p-type semiconductor layer, a p-type electrode provided on the p-type semiconductor layer, and a pad provided on the p-type electrode. The p-type electrode at least has an ohmic metal layer placed on the p-type semiconductor layer side and a barrier layer that is placed closer to the pad than the ohmic metal layer and includes a TiN layer. In a top view, when a region of the barrier layer that does not overlap an electrical connection region between the pad and the barrier layer is defined as a surface diffusion inhibiting surface, the surface diffusion inhibiting surface is formed in a circular pattern. The embodiments will now be described.

Embodiment 1

[Overall Structure]

FIG. 1 illustrates an example of a semiconductor light-emitting device 100 according to this embodiment (hereinafter referred to as a light-emitting device 100). The light-emitting device 100 includes a substrate 10 made of sapphire, an AlN single crystal, or the like; an n-type semiconductor layer 11 that is an n-type AlGaN-based semiconductor layer provided on the substrate 10; a light emitting layer 12 provided on the n-type semiconductor layer 11; a p-type semiconductor layer 13 provided on the light emitting layer 12; a layered p-type electrode 2 provided on the p-type semiconductor layer 13; a Pt-containing layer 3 provided on the p-type electrode 2; and a pad 4 provided on the p-type electrode 2 with the Pt-containing layer 3 therebetween. The light-emitting device 100 further has an n-type ohmic electrode 91 provided on the n-type semiconductor layer 11, and a Pt-containing layer 92 on the n-type ohmic electrode 91 and an n-side pad 94. This embodiment describes an example in which the light-emitting device 100 is a lateral device.

When the light-emitting device 100 is mounted on an electronic substrate of a device, p-side and n-side pads 4, 94 are each connected to wiring of the electronic substrate (for example, a pad of the electronic substrate) using a joint material. In this embodiment, the light-emitting device 100 employs a connection structure in which a joint material 5 containing Ag is placed on the p-side pad 4 and a joint material 95 is placed on the n-side pad 94, so that the joint materials are each connected to external wiring. Further, a protective film 6 is formed such that an electric current flows through the light emitting layer 12 between the p-side and n-side pads 4 and 94. An n-type layer protective film formation region 11*a* separate the light emitting layer 12 and the p-type semiconductor layer 13 from the n-type ohmic electrode 91 to prevent a short circuit therebetween.

In the light-emitting device 100, when Ag in the joint material 5 moves to the p-type electrode 2 due to migration, the effect of the migration of Ag would reach the p-type electrode 2 and the light emitting layer 12, and Ag would cause a short circuit between the p-type layer and the n-type layer, thus the light-emitting device 100 would not emit light (emission failure). However, in the light-emitting device 100, the migration of Ag in the joint material 5 into the light emitting layer 12 through the pad 4, the Pt-containing layer 3, and the p-type semiconductor layer 13 is inhibited as described above by the connection structure of the p-type electrode 2, the Pt-containing layer 3, and the pad 4, and others. In the light-emitting device 100, the above structure suppresses the detrimental effects such as discoloration of the p-type electrode 2 and emission failure of the light emitting layer 12.

[Parts]

The p-type semiconductor layer 13 is a layer made of a p-type AlGaN-based semiconductor, and is a so-called p-type contact layer. The p-type electrode 2 is placed on one of the surfaces of the p-type semiconductor layer 13. The light emitting layer 12 is placed on the other surface of the p-type semiconductor layer 13. The p-type semiconductor layer 13 forms an ohmic contact with the p-type electrode 2. The p-type semiconductor layer 13 is preferably highly conductive. The p-type semiconductor layer 13 may be heavily doped with p-type impurities. This increases the conductivity. It is preferred that $0 \leq x \leq 0.5$ holds where the Al composition of the p-type semiconductor layer 13 is x.

The p-type electrode 2 has an ohmic metal layer 21 and a barrier layer 22 containing TiN. The ohmic metal layer 21 (also referred to as p-type ohmic electrode) is placed closer to the p-type semiconductor layer 13 side than the barrier layer 22. In other words, the barrier layer 22 is placed closer to the pad 4 than the ohmic metal layer 21. When the p-type electrode 2 is viewed from above (a view obtained by viewing the surface of the p-type electrode 2 from the pad 4 side in the vertical direction may be hereinafter referred to as a top view), a region of the ohmic metal layer 21 overlaps a region of the barrier layer 22. The region of the ohmic metal layer 21 may include the region of the barrier layer 22. Specifically, in the top view, the region of the barrier layer 22 may completely overlap the region of the ohmic metal layer 21 or may be included in the region of the ohmic metal layer 21.

The ohmic metal layer 21 may use any known combination of metals as long as it is a metal layer that can form an ohmic contact with the p-type semiconductor layer 13. The ohmic metal layer 21 preferably contains Ni (nickel) and Au (gold), for example. In this case, the ohmic metal layer 21 is preferably formed by forming a Ni layer on the p-type semiconductor layer 13, and further forming an Au layer on the Ni layer by vapor deposition or sputtering. Note that in order to form an ohmic contact, the ohmic metal layer 21 is preferably heated to cause diffusion between the Ni layer and the p-type semiconductor layer 13.

Further, the ohmic metal layer 21 may contain Rh (rhodium). It is also preferred that the ohmic metal layer 21 has a composition including for example Ni (nickel) and Rh (rhodium). It is also preferred that the ohmic metal layer 21 has a composition consisting of Ni (nickel), Rh (rhodium), and Au (gold). This disclosure is intended to suppress detrimental effects such as discoloration of the p-type electrode 2 and emission failure of the light emitting layer 12. Therefore, metals that affect the ohmic metal layer 21 in contact with the p-type semiconductor layer 13 (Ag, Al, etc.) are not deliberately contained. Accordingly, cases where the ohmic metal layer 21 contains Ag or Al are excluded from this embodiment.

Figure 2:
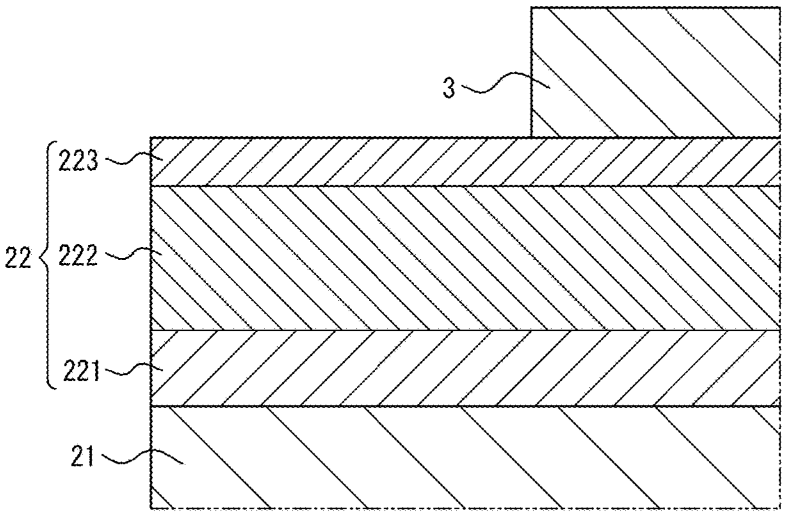
FIG. 2 is a cross-sectional view illustrating the structure of a barrier layer.

The barrier layer 22 is a layer that at least includes a TiN layer 222 as depicted in FIG. 2. The barrier layer 22 may include, in addition to the TiN layer, a metal layer made of a metal that provides good adhesion to the TiN layer. Ti is an example of the metal that provides good adhesion to the TiN layer. The TiN layer 222 included in the barrier layer 22 is preferably sandwiched between Ti layers such that a layer of Ti, a layer of TiN, and a layer of Ti are stacked in this order.

The thickness of the TiN layer 222 is preferably 100 nm or more and 2000 nm or less, more preferably 500 nm or more and 1500 nm or less. This can inhibit the migration of Ag. Note that when the thickness of the TiN layer 222 is less than 100 nm, the Ag migration inhibiting effect would be small. When the thickness of the TiN layer 222 exceeds 2000 nm, the electric resistance of the p-type electrode 2 would be high (the so-called forward voltage would be high).

The barrier layer 22 preferably has a layer of Ti on its surface. This can inhibit oxidation of the barrier layer 22. Further, the joint of the barrier layer 22 with other metals and the protective film 6 can be maintained. The barrier layer 22 of this embodiment has, as depicted in FIG. 2, in addition to the TiN layer 222, a first Ti layer 221 that is a layer of Ti formed on the surface of the TiN layer 222 on the ohmic metal layer 21 side, and a second Ti layer 223 that is a layer of Ti formed on the surface of the TIN layer 222 on the pad 4 side, thus the surfaces of the barrier layer 22 on the ohmic metal layer 21 side and the pad 4 side are constituted by the surfaces of the layers of Ti. Accordingly, the surfaces of the barrier layer 22 on the ohmic metal layer 21 side and the pad 4 side form the surfaces of the layers of Ti.

The thickness of the metal layer on the surface of the TiN layer 222 on the pad 4 side in the barrier layer 22 (the second Ti layer 223 in this embodiment) is preferably sufficiently thin. This can inhibit the migration of Ag. Specifically, the thickness of the metal layer on the surface of the TiN layer 222 on the pad 4 side is preferably 1 nm or more and 20 nm or less, more preferably 5 nm or more and 15 nm or less.

Inhibition of Ag migration in the barrier layer 22 will be described in detail. The inventors focused on the following points with respect to Ag migration in the process of making this disclosure. The TiN layer 222 having some thickness effectively inhibits the migration of Ag passing through the layer. However, when a thick metal layer is present on the TiN layer 222 and Ag reaches a side surface of the TiN layer 222, migration of Ag through the side surface would occur.

Upon focusing on the above, the inventors considered that it was important to inhibit Ag that passed through the layer and was inhibited from migrating toward the side surface in addition to inhibit the migration of Ag passing through the layer. The move of Ag along the surface of the TiN layer 222 is conceivably slower than the move of Ag in other metals. Accordingly, the inventors inhibited the migration of Ag into the ohmic metal layer 21 and the light emitting layer 12 by forming a surface diffusion inhibiting surface S to be described in the barrier layer 22. When the thickness of the metal layer on the surface of the TiN layer 222 on the pad 4 side exceeds 20 nm, Ag can move in the direction of the side surface using the metal layer, thus it is not preferred that a thick metal layer is present on the TiN layer 222.

Accordingly, a region where the Pt-containing layer 3 and the pad 4 are not formed is reserved in the surface of the barrier layer 22 on the pad 4 side (the surface of the second Ti layer 223 or the TiN layer 222 above). The region in the surface of the barrier layer 22 on the pad 4 side where the Pt-containing layer 3 and the pad 4 are not formed is hereinafter referred to as a surface diffusion inhibiting surface S. Forming (reserving) the surface diffusion inhibiting surface S inhibits Ag from reaching (migrating into) the ohmic metal layer 21 and the light emitting layer 12. When Ag is inhibited from migrating through the barrier layer 22 (migrating in the vertical direction), migration of Ag along the surface of the barrier layer 22 occurs relatively more easily. Forming the surface diffusion inhibiting surface S can inhibit the migration of Ag along the surface of the barrier layer 22. In this embodiment, the second Ti layer 223 is exposed in the surface diffusion inhibiting surface S, and the entire surface of the surface diffusion inhibiting surface S forms a Ti surface.

The TiN layer 222 is preferably inhibited from being deteriorated, for example, from being oxidized. This can maintain the barrier effect of the barrier layer 22. To prevent oxidation, it is preferred that the heat for forming an ohmic contact between the ohmic metal layer 21 and the p-type semiconductor layer 13 does not affect the barrier layer 22. Accordingly, the heating for forming an ohmic contact is preferably performed only on the ohmic metal layer 21. Further, the heating is preferably performed before the formation of the barrier layer 22.

The pad 4 is formed on the barrier layer 22, that is, on the side of the p-type electrode 2 opposite to the p-type semiconductor layer 13. The pad 4 is provided so that the joint material 5 is joined onto the pad 4 or the joint material 5 is formed on the pad 4. The pad 4 is preferably a metal having adhesion to the joint material 5 containing Ag and oxidation resistance. The pad 4 is preferably made of mainly a platinum group element such as Pt or Pd (palladium) aside from Au. With a view to improving the adhesion to the joint material 5, the pad 4 may partially contain a metal such as Ti, Ni, Cr (chromium), or Sn (tin).

As depicted in FIG. 1, the Pt-containing layer 3 may be placed between the barrier layer 22 and the pad 4. In this embodiment, the Pt-containing layer 3 is placed between the barrier layer 22 and the pad 4. The Pt-containing layer 3 overlaps the pad 4 in a top view. In this embodiment, the Pt-containing layer 3 is smaller than the pad 4 and is surrounded by a region of the pad 4 in the top view. The Pt-containing layer 3 is a metal layer in which, for example, a layer of Ti, a layer of Pt, a layer of Au, and a layer of Ti are stacked in this order. The Pt-containing layer 3 has a thickness exceeding 20 nm.

Figure 3:
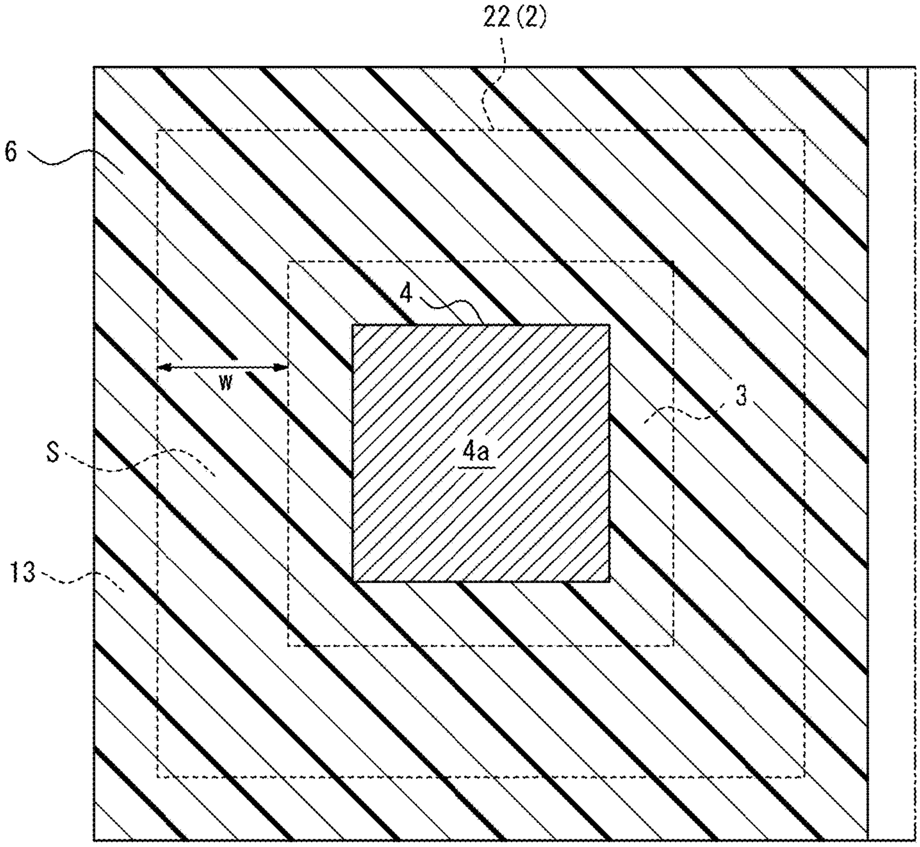
FIG. 3 is a cross-sectional arrow view taken along line III-III in FIG. 1.

In this case, as depicted in FIG. 1 and FIG. 3, in a top view, the region of the Pt-containing layer 3 is to be included in the region of the barrier layer 22. In other words, in a top view, the region of the Pt-containing layer 3 is to be surrounded by the region of the barrier layer 22. Thus, the surface of the barrier layer 22 is exposed in the pad 4 and the Pt-containing layer 3, thus the surface diffusion inhibiting surface S can be formed. The Pt-containing layer only has to have the effect of inhibiting the diffusion of metals other than Ag by Pt, and may have metals such as Ti, Ni, Au, or the like in addition to Pt.

Note that the joint material 5 contains Ag, and only has to be a material that allows for an electrical connection between the pad and the wiring of the electronic substrate (for example, a pad of the electronic substrate); examples include solder containing Ag and paste containing Ag powder. The solder may use, for example, Sn—Ag—Cu-based solder (SN96CI manufactured by NIHON SUPERIOR CO., LTD.) or SN97C manufactured by NIHON SUPERIOR CO., LTD., and the paste containing Ag powder may use, for example, DD-1760L manufactured by Kyoto Elex Co., Ltd.

The pad portion **4*a* is a surface part of the pad 4 that is electrically connected to a layer on the barrier layer 22 side. In the light-emitting device emitting 100, the above Pt-containing layer 3 is interposed between the pad 4 and the barrier layer 22**.

Specifically, as illustrated in FIG. 1, the pad portion **4*a* of the pad 4 is adjacent to the Pt-containing layer 3, and the pad 4 is electrically connected to the barrier layer 22 via the Pt-containing layer 3. In this case, the pad portion 4*a* constitutes an interface between the pad 4 and the Pt-containing layer 3. In this case, the Pt-containing layer 3 is defined as an electrical connection region between the pad 4 and a layer on the barrier layer 22** side (hereinafter may simply be referred to as a connection region).

Note that the pad 4 preferably has a shape such that the area of the pad portion **4*a* is smaller than the area of the surface of the pad 4 to which the joint material 5** is joined.

The surface diffusion inhibiting surface S is, for example, formed such that at least the pad portion **4*a* is included in the region of the barrier layer 22 in a top view. In other words, the surface diffusion inhibiting surface S can be formed such that the outer peripheral portion of the surface of the barrier layer 22 on the pad 4 side does not overlap the pad portion 4***a* and is exposed in the pad portion 4*a* in a top view.

The surface diffusion inhibiting surface S is preferably not in contact with conductive metals. Therefore, in the light-emitting device 100, an insulating protective film 6 covering the outer periphery and the surface of the barrier layer 22 may be formed. The barrier layer 22 may be in contact with the protective film 6 on the surface diffusion inhibiting surface S. The protective film 6 is made of a dielectric such as $SiO_2$ (silicon dioxide) or SiN (silicon nitride). The protective film also inhibits Ag from migrating through the film.

When the protective film 6 is formed, in a top view, the region where the barrier layer 22 is exposed in the protective film 6 (the region to be the connection region between the barrier layer 22 and the pad 4 on the barrier layer 22 side) is included in the region of the barrier layer 22. The pad 4 may be formed on the barrier layer 22 so as to be connected to the region where the barrier layer 22 is exposed in the protective film 6, thereby forming the surface diffusion inhibiting surface S.

Thus, in a top view, on the surface diffusion inhibiting surface S, the region of the barrier layer 22 includes the connection region where the Pt-containing layer 3 as a metal formed on the barrier layer 22 is in contact with the barrier layer 22. Accordingly, the surface diffusion inhibiting surface S is a portion of the barrier layer 22 that does not overlap the connection region in a top view. The surface diffusion inhibiting surface S is reserved as a circular (ring-shaped, hollow) region formed by excluding the connection region from the barrier layer 22. In other words, the entire circumference of the connection region where the Pt-containing layer 3 is in contact with the barrier layer 22 is surrounded by the region of the barrier layer 22 in a top view. In this embodiment, in a top view, the entire circumference of a region of the Pt-containing layer 3 is surrounded by the region of the barrier layer 22. Further, in the top view, the entire circumference of the pad portion 4*a* is surrounded by the region of the Pt-containing layer 3.

In the following description, the shortest width w of the surface diffusion inhibiting surface S refers to the shortest width of the circular region in the plane direction (diameter direction). In this embodiment, the shortest distance between the outer periphery of the connection region where the Pt-containing layer 3 is in contact with the barrier layer 22, and the outer periphery of the region of the barrier layer 22 is the shortest width w of the surface diffusion inhibiting surface S.

The shortest width w is preferably larger than the thickness of the TiN layer 222 of the barrier layer 22, and is preferably 3 μm or more and 50 μm or less. When the shortest width w is less than 3 μm, Ag ions would move along the surface of the barrier layer 22, and the migration would not be sufficiently inhibited. When the shortest width w exceeds 50 μm, designing the electrode shape that suits the chip size (one side of a chip is typically 300 μm or more and 2000 μm or less) would be difficult.

The light-emitting device 100 is formed through the following steps. That is, the method of producing the light-emitting device 100 includes at least a p-type electrode formation step of forming the p-type electrode 2 on the p-type semiconductor layer 13 and a pad formation step of forming the pad 4 on the p-type electrode 2.

The p-type electrode formation step includes an ohmic metal layer formation step of forming the ohmic metal layer 21 on the p-type semiconductor layer 13 side, and a barrier layer formation step of forming the barrier layer 22 including a TiN layer closer to the pad 4 than the ohmic metal layer 21. The p-type electrode 2 is obtained by forming the ohmic metal layer 21 and the barrier layer 22 in this order from the p-type semiconductor layer 13 side. In the p-type electrode formation step, heat treatment necessary for forming an ohmic contact between the ohmic metal layer 21 and the p-type semiconductor layer 13 side is also performed. This heat treatment is preferably performed before the formation of the barrier layer 22.

In the pad formation step, the pad 4 is formed such that the electrical connection region between the pad 4 and the barrier layer 22 is surrounded by the region of the barrier layer 22 in a top view. In other words, the surface diffusion inhibiting surface S is circularly formed by forming the pad 4 such that the connection region between the pad 4 and the barrier layer 22 is included in the region of the barrier layer 22 in a top view. Thus, in the pad formation step, the surface diffusion inhibiting surface S is formed as a region of the barrier layer 22 that does not overlap the electrical connection region between the pad 4 and the barrier layer 22.

It is also preferred that the light-emitting device 100 has a structure in which the n-type semiconductor layer 11 is partially exposed by partially etching the p-type semiconductor layer 13 and the light emitting layer 12, the n-type ohmic electrode 91 is on the exposed n-type semiconductor layer 11, the p-type electrode 2 is on the p-type semiconductor layer 13, and a current is flown between the n-type ohmic electrode 91 and the p-type electrode 2. An interface between the n-side pad 94 and the Pt-containing layer 92 is depicted as an n-side pad portion 94*a*. The n-side pad portion 94*a* serves as an electrical connection region between the n-side pad 94 and a layer on the n-type ohmic electrode 91 side (Pt-containing layer 92).

The ohmic metal layer 21, the barrier layer 22, the Pt-containing layer 3, and the pad 4 can be formed by sputtering or vapor deposition. The TiN layer 222 in the barrier layer 22 can be formed by for example, PVD coating, CVD, or sputtering. For the formation of the TiN layer 222, reactive sputtering is preferably used in which a pure Ti target is sputtered in an Ar gas atmosphere containing nitrogen gas.

Embodiment 2

Figure 4:
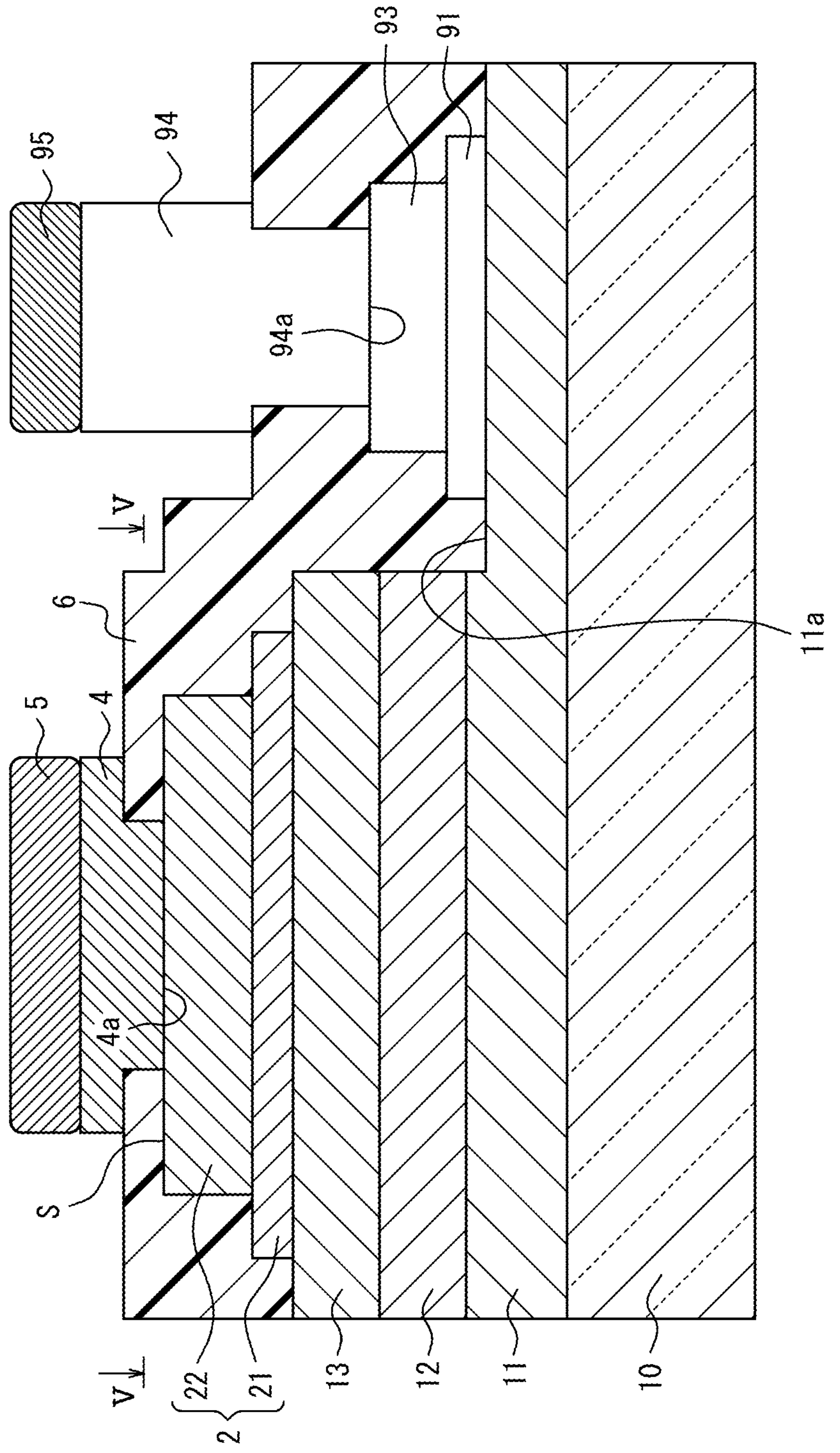
FIG. 4 is a cross-sectional view illustrating a schematic structure of a light-emitting device and a semiconductor light-emitting device connecting structure according to Embodiment 2.
Figure 5:
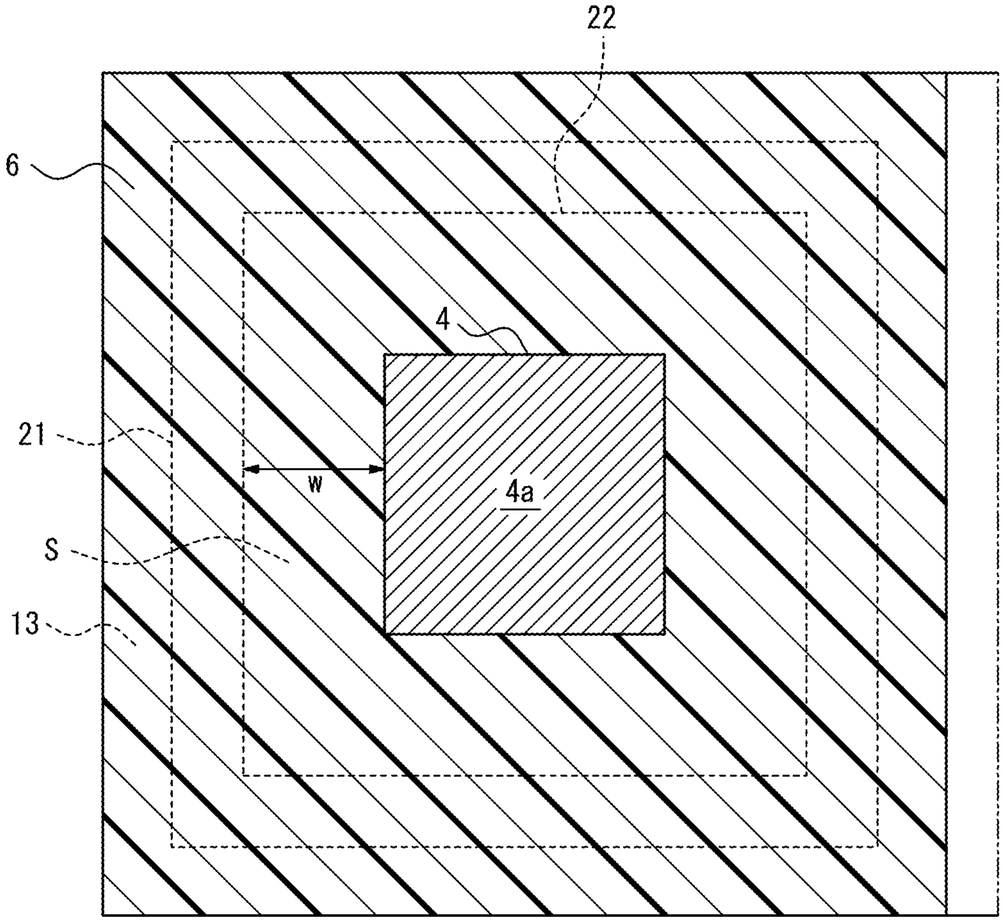
FIG. 5 is a cross-sectional arrow view taken along line V-V in FIG. 4.

Embodiment 2 is different from Embodiment 1 in that the light-emitting device 100 does not have the Pt-containing layer 3 and has a barrier layer 93 on the n-type ohmic electrode 91 instead of the Pt-containing layer 92 as illustrated in FIG. 4. Another difference is that, as depicted in FIG. 4 and FIG. 5, the barrier layer 22 is smaller than the ohmic metal layer 21 in a top view. Embodiment 2 is the same as Embodiment 1 except for the above points. The following only describes the differences from Embodiment 1.

As depicted in FIG. 4 and FIG. 5, in the p-type electrode 2, the barrier layer 22 is smaller than the ohmic metal layer 21 in a top view. As depicted in FIG. 5, in a top view, a region of the ohmic metal layer 21 includes a region of the barrier layer 22, and the barrier layer 22 is surrounded by the region of the ohmic metal layer 21.

As depicted in FIG. 4, the pad 4 and the barrier layer 22 are adjacent to one another, and they are in contact with and directly and electrically connected to each other. In this case, the pad portion 4*a* constitutes the interface between the pad 4 and the barrier layer 22. In this case, the pad portion 4*a* is defined as an electrical connection region between the pad 4 and a layer on the barrier layer 22 side.

Thus, in a top view, for the surface diffusion inhibiting surface S, the region of the barrier layer 22 includes the connection region where the pad 4 as a metal formed on the barrier layer 22 is in contact with the barrier layer 22. The surface diffusion inhibiting surface S is a circular region defined by excluding the connection region from the barrier layer 22 as in Embodiment 1. In other words, the entire circumference of the pad portion 4*a* serving as the connection region where the pad 4 is in contact with the barrier layer 22 is surrounded by the region of the barrier layer 22 in the top view.

In this embodiment, the shortest distance between the outer periphery of the connection region (pad portion 4 a) where the pad 4 is in contact with the barrier layer 22 and the outer periphery of the region of the barrier layer 22 is the shortest width w of the surface diffusion inhibiting surface S.

EXAMPLES

Examples of the light-emitting devices 100 according to the above embodiments will be described.

Example 1

Figure 6:
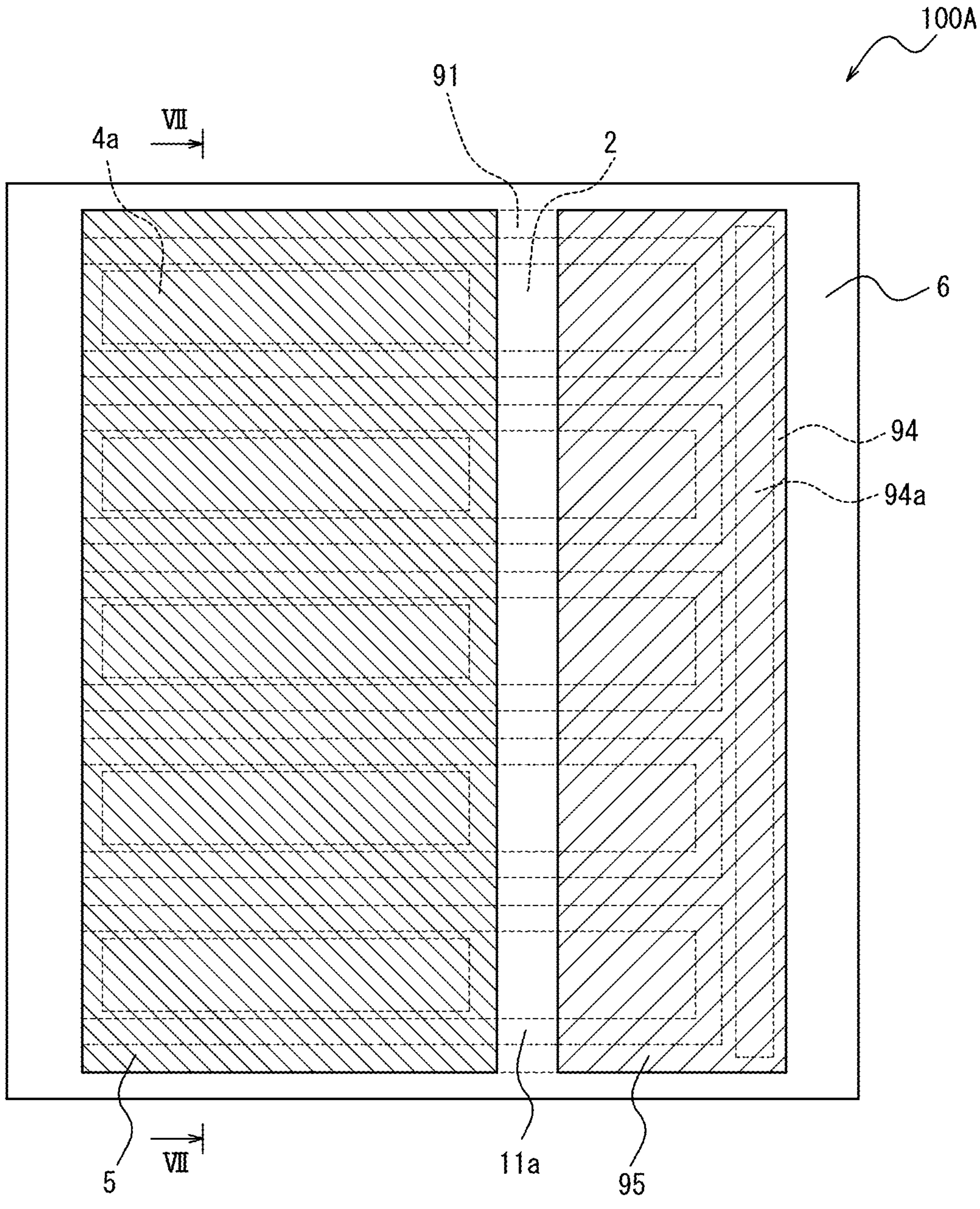
FIG. 6 is a top view of a light-emitting device of Embodiment 1.

A light-emitting device 100A having a shape based on the shape of the light-emitting device 100 of Embodiment 1 depicted in FIG. 1 was prepared as a light-emitting device according to Example 1. FIG. 6 illustrates an example of the arrangement of a p-type electrode 2 and an n-type ohmic electrode 91; p-side and n-side pad portions 4*a*, 94*a*; and p-side and n-side joint materials 5, 95 in the light-emitting device of Example 1.

Figure 7:
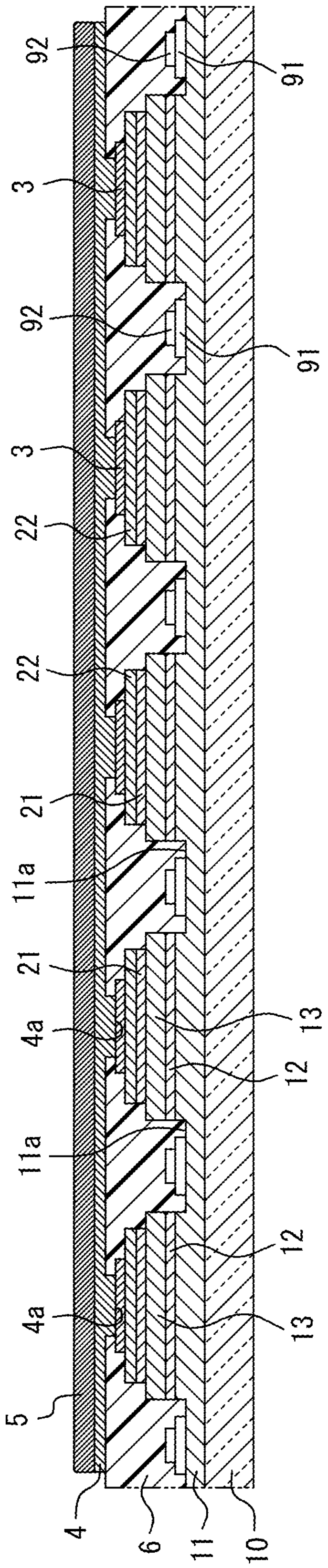
FIG. 7 is a cross-sectional arrow view taken along line VII-VII in FIG. 6.

FIG. 7 presents a cross-sectional arrow view of the light-emitting device depicted in FIG. 6 taken along line VII-VII. In the light-emitting device according to Example 1, the p-type electrode 2 formed almost entirely over the p-type semiconductor layer 13 had five aligned strip shapes between which an interdigitated n-type ohmic electrode 91 lies, and an n-type layer protective film formation region 11*a* was formed in a shape in which the n-type semiconductor layer 11 is exposed lies, with no electrode being formed, between the p-type electrode 2 and the n-type ohmic electrode 91 as depicted in FIG. 6. The strip shapes of the p-type electrode 2 in the light-emitting device 100A of this example, the shape of the interdigitated part of the n-type ohmic electrode 91; the p-side and n-side pads 4, 94 to be described; and pad portions 4*a*, 94*a* serving as connection regions were similar to those in semiconductor light-emitting devices 100 disclosed in the description and the drawings (FIG. 1 to FIG. 7) of JP 2019-106406 A, and were prepared to have the same characteristics as those of the elements other than the size and the structure (the arrangement of ohmic electrodes, barrier layers, Pt-containing layers, pads, etc.). The conditions for preparing each layer are described below in detail.

A sapphire substrate (diameter: 2 in, thickness: 430 μm, plane orientation: (0001), off-angle θ in m-axis direction: 0.11°) serving as a substrate 10 was prepared. Next, an AlN layer having a center thickness of 0.50 μm (average thickness: 0.51 μm) was grown on the above sapphire substrate by MOCVD to obtain an AlN template substrate. Here, the growth temperature of the AlN layer was 1330 °C, the growth pressure in the chamber was 10 Torr, and the growth gas flow rates of ammonia gas and trimethylaluminum (TMA) gas were set so that the Group V/Group III ratio would be 206. The flow rate of a Group V element gas ($NH_3$) was 250 sccm, and the flow rate of a Group III element gas (TMA) was 53 sccm. For the thickness of the AlN layer, the thicknesses of total 25 portions distributed at regular intervals, including the center of the wafer plane (AlN template substrate) were measured using an interference thickness measurement system (Nanospec M6100A manufactured by Nanometrics Incorporated).

Next, the above AlN template substrate was introduced into a heat treatment furnace. After the pressure in the furnace was reduced to 10 Pa, the furnace was purged with nitrogen gas to achieve a nitrogen gas atmosphere in the furnace, and the temperature inside the furnace was then raised, thus performing heat treatment on the AlN template substrate. The heat treatment was performed at a heating temperature of 1650 °C for a heating time of 4 hours.

Subsequently, an undoped AlGaN layer (undoped layer) with a thickness of 30 nm in which the average Al composition was 0.4 was formed as an undoped AlGaN layer by MOCVD. Next, as an n-type semiconductor layer 11, a Si-doped n-type layer made of $Al_{0.30}Ga_{0.70}N$ was formed to a thickness of 2 μm. According to the results of SIMS analysis, the Si concentration of the n-type layer was $5.0\times10^{18}$ atoms/cm$^3$.

Subsequently, as a light emitting layer 12, a Si-doped n-type guide layer made of $Al_{0.30}Ga_{0.70}N$ was formed to a thickness of 30 nm on the n-type layer, and $Al_{0.25}Ga_{0.75}N$ was then formed thereon as a barrier layer to a thickness of 14 nm. Next, two well layers made of $Al_{0.10}Ga_{0.90}N$ with a thickness of 2 nm and two barrier layers made of $Al_{0.25}Ga_{0.75}N$ with a thickness of 14 nm were alternately formed, and another well layer made of $Al_{0.10}Ga_{0.90}N$ with a thickness of 2 nm was formed thereon. Accordingly, the number N of both the well layers and the barrier layers was 3, the Al composition b of the barrier layers was 0.25, and the Al composition of the well layers was 0.10. In the formation of the barrier layers, the barrier layers were doped with Si.

After that, on the third well layer, an undoped AlGaN guide layer made of $Al_{0.25}Ga_{0.75}N$ was formed using nitrogen gas as a carrier gas. The thickness of the AlGaN guide layer was 30 nm. Next, while the supply of the TMA gas was ceased and ammonia gas was continuously supplied, the supply of nitrogen that was the carrier gas was ceased and hydrogen was supplied. After the carrier gas was changed to hydrogen, the supply of TMA gas and trimethylgallium (TMG) gas that were source gases of group III elements was resumed, thus a Mg-doped p-type electron blocking layer made of $Al_{0.45}Ga_{0.55}N$ was formed to a thickness of 25 nm. After growing the p-type electron block layer to a predetermined thickness, the gas flow rate ratio of the TMA gas and the TMG was changed thereby forming a Mg-doped AlGaN cladding layer (p-type cladding layer) made of $Al_{0.20}Ga_{0.80}N$ with a thickness of 235 nm.

Subsequently, after the growth of the AlGaN cladding layer was stopped, the carrier gas was changed to nitrogen gas, and after changing the gas flow rate to achieve the condition set for a p-type GaN contact layer, the carrier gas was changed to hydrogen, thus a Mg-doped p-type GaN contact layer (p-type contact layer) with a thickness of 12 nm was formed as the p-type semiconductor layer 13. According to the results of SIMS analysis, the Mg concentration of the p-type contact layer was $5.0\times10^{20}$ atom/cm$^3$ on average. The growth rate in forming the p-type contact layer in the thickness direction was 0.43 μm/h.

The specifications of each layer in the III-nitride semiconductor light-emitting device according to Example 1 prepared as described above are given in Table 1.

TABLE 1

| | Al composition | Dopant | Thickness |
|---|---|---|---|
| p-type contact layer | 0 | Mg | 12 nm |
| p-type cladding layer | 0.20 | Mg | 235 nm |
| p-type blocking layer | 0.45 | Mg | 25 nm |
| AlGaN guide layer | 0.25 | — | 30 nm |
| Light emitting layer | 0.10 | — | 2 nm |
| | 0.25 | Si | 14 nm |
| | 0.10 | — | 2 nm |
| | 0.25 | Si | 14 nm |
| | 0.10 | — | 2 nm |
| | 0.25 | Si | 14 nm |
| n-type guide layer | 0.30 | Si | 30 nm |
| n-type semiconductor layer | 0.30 | Si | 2 μm |
| Undoped layer | 0.40 | — | 30 nm |
| AlN layer | 1 | — | 0.5 μm |
| Sapphire substrate | — | — | 430 μm |

After that, a mask was formed on the p-type semiconductor layer 13, and mesa etching was performed by dry etching to expose part of the n-type semiconductor layer 11; and a p-type ohmic electrode made of Ni/Rh/Au was formed as the ohmic metal layer 21 on the p-type semiconductor layer 13 so that the five strip shapes were aligned. In the p-type ohmic electrode as the ohmic metal layer 21, the thickness of Ni was 7 nm, the thickness of Rh was 50 nm, and the thickness of Au was 20 nm.

The n-type ohmic electrode 91 constituted by a metal layer in which a layer of Ti, a layer of Al, and a layer of Ti were stacked in this order was formed in a comb shape in which the comb teeth lie between the above strip shapes on the n-type semiconductor layer 11 exposed by mesa etching. Between the strip shapes and the comb teeth (and on the chip periphery), the n-type layer protective film formation region 11*a* where the n-type semiconductor layer 11 was exposed with no electrode formed thereon was provided. In the n-type ohmic electrode 91, the thickness of Ti was 200 angstroms, the thickness of Al was 600 nm, and the thickness of Ti was 5 nm. Finally, contact annealing (RTA) was performed at 550 °C to finish the electrodes.

After that, as illustrated in FIG. 1, the barrier layer 22 having a layered structure in which a layer of Ti (first Ti layer 221), a layer of TiN (TiN layer 222) and a layer of Ti (second Ti layer 223) are stacked in this order on the p-type ohmic electrode as the ohmic metal layer 21 was formed with a size equal to the size of the p-type ohmic electrode. The strip shapes of the p-type ohmic electrode as the ohmic metal layer 21 and the barrier layer 22 each had a size of long side: 742 μm×short side: 94 μm in a top view; and the thickness of the first Ti layer 221 was 10 nm, the thickness of the TiN layer 222 was 1 μm, and the thickness of the second Ti layer 223 was 10 nm.

The first Ti layer 221 in the barrier layer 22 was formed by sputtering, and the TiN layer 222 was formed by reactive sputtering of a pure Ti target at room temperature in a nitrogen gas-containing Ar gas atmosphere ($N_2$: 35.1 sccm, Ar: 94.9 sccm), followed by the termination of the flow of nitrogen gas, and the second Ti layer 223 was formed anew by sputtering.

After that, on the barrier layer 22, the Pt-containing layer 3 in which a layer of Ti, a layer of Pt, a layer of Au, and a layer of Ti were stacked in this order was formed. The Pt-containing layer 3 was formed to be surrounded by the barrier layer 22 in a top view. Part of the surface of the barrier layer 22 where the Pt-containing layer 3 was not formed was the surface diffusion inhibiting surface S. The Pt-containing layer 3 had a rectangular shape having a size of long side: 734 μm×short side: 86 μm in a top view. The shortest width w of the surface diffusion inhibiting surface S was 4 μm. The thicknesses of the layer of Ti, the layer of Pt, the layer of Au, and the layer of Ti in the Pt-containing layer 3 were 50 nm, 50 nm, 500 nm, and 10 nm, respectively.

A Pt-containing layer 92 in which a layer of Ti, a layer of Pt, a layer of Au, and a layer of Ti were stacked in this order was formed also on the comb base body of the n-type ohmic electrode 91 (in the vertical direction of the extending direction of the comb teeth). The Pt-containing layer 92 was the same as Pt-containing layer 3, and they were formed at the same time.

After that, a protective film 6 (thickness: 1 μm) made of $SiO_2$ was formed on the entire surface, and the protective film 6 on the upper surface of the Pt-containing layer 3 was removed by BHF to expose the Pt-containing layer 3. The exposed regions (where the pad portions 4*a* were to be formed) were formed with a smaller size than the Pt-containing layer 3. The exposed regions each had a strip shape with a size of long side: 329 μm×short side: 72 μm.

As illustrated in FIG. 6, the pad 4 in which a layer of Ti, a layer of Au, a layer of Ti, a layer of Pt, and a layer of Au were stacked in this order was formed on the exposed regions the Pt-containing layer 3. As illustrated in FIG. 7, the pad 4 was formed also on part of the protective film 6 such that the strips of the pad portions 4*a* are connected over the n-type ohmic electrode 91 and the n-type layer protective film formation region 11*a* between the strips on the protective film 6. The thickness of Ti was 10 nm, the thickness of Au was 100 nm, the thickness of Ti was 150 nm, the thickness of Pt was 100 nm, and the thickness of Au was 2500 nm.

After that, Sn—Ag—Cu solder paste (SN96CI RMA FDQ H-1 manufactured by NIHON SUPERIOR CO., LTD.) as the joint material 5 was applied onto the pad 4 to cover the entire surface of the pad 4, so that the size of the coated part was 0.4 $mm^2$ to 0.5 $mm^2$.

As with the case of forming the pad 4, an n-side pad 94 was formed on the n-side Pt-containing layer 92 with a region of the protective film 6 (see FIG. 1) having been removed by BHF and exposed (where the n-side pad portions 94*a* were to be formed) therebetween, and Sn—Ag—Cu solder paste was applied as the joint material 95. As with the pad 4, the n-side pad 94 was formed also on part of the protective film 6. As with the pad 4, for the n-side pad 94, the n-side pad portions 94*a* of the n-side pad 94 were in contact with the Pt-containing layer 92 (see FIG. 1), and served as an electrical connection region.

Finally, isolation was performed using a laser dicing apparatus and a breaking system to obtain separate chips of light-emitting devices (light-emitting device 100A). The chip had a rectangular shape with a size of 1000 μm×1000 μm.

Example 2

A light-emitting device 100A having a shape based on the shape of the light-emitting device 100 of Embodiment 2 depicted in FIG. 2 was prepared as a light-emitting device according to Example 2. The light-emitting device 100A according to Example 2 was prepared in the same manner as in Example 1 except for the following points.

On the p-type ohmic electrode, a barrier layer 22 having the same layer structure as that in Example 1 was formed to have a strip shape with a smaller size than the p-type ohmic electrode as the ohmic metal layer 21 (long side: 734 μm×short side: 86 μm). Further, a protective film (thickness: 1 μm) made of $SiO_2$ was formed on the entire surface of the barrier layer 22 on the second Ti layer 223 side without the Pt-containing layer 3 being formed on the barrier layer 22. After that, the protective film of a region of the inner portion of regions of the surface of the barrier layer 22 where a surface diffusion inhibiting surface S was to be formed was removed and exposed using BHF. The exposed regions (where pad portions 4*a* were to be formed) had a strip shape with a size of long side: 329 μm×short side: 72 μm, and the pad 4 was formed on the exposed barrier layer 22.

Further, for metals to be formed on the n-type ohmic electrode 91, a barrier layer 93 in which a layer of Ti, a layer of TiN, and a layer of Ti are stacked in this order was used instead of the Pt-containing layer 92 in Example 1 (see FIG. 4). The barrier layer 93 was the same as the barrier layer 22, and they were formed at the same time. Further, isolation was performed in the same manner as in Example 1 to obtain chips of light-emitting devices (light-emitting device 100A) according to Example 2. Note that the shortest width w of the surface diffusion inhibiting surface S was 7 μm.

Example 3

Chips of light-emitting devices (light-emitting device 100A) in Example 3 were produced in the same manner as in Example 1 except that the thickness of the TiN layer 222 in the barrier layer 22 was changed from 1 μm to 500 nm.

Example 4

Chips of light-emitting devices (light-emitting device 100A) in Example 4 were produced in the same manner as in Example 2 except that the thickness of the TiN layer 222 in the barrier layer 22 was changed from 1 μm to 500 nm.

Comparative Example 1

Chips of light-emitting devices according to Comparative Example 1 were produced in the same manner as in Example 1 except that a metal layer in which a layer of Pt, a layer of Au, and a layer of Ti were stacked in this order (barrier layer that does not include a TiN layer) was formed instead of the barrier layer 22 in Example 1. The thickness of Pt was 50 nm, the thickness of Au was 100 nm, and the thickness of Ti was 5 nm.

Comparative Example 2

Chips of light-emitting devices according to Comparative Example 2 were produced in the same manner as in Example 1 except that on a barrier layer 22 the same as one in Example 1, a Pt-containing layer having the same layer structure as that of the Pt-containing layer 3 in Example 1 was formed to be concentric with and equal in size with the barrier layer 22 (i.e., a surface diffusion inhibiting surface was not reserved). Accordingly, in the chips of Comparative Example 2, the entire surface of the barrier layer on the Pt-containing layer side is covered with the Pt-containing layer, and the surface diffusion inhibiting surface S was not present.

Table 2 gives the list of the layer structure, the presence or absence of each light-emitting device of Examples 1, 2 and Comparative Examples 1, 2.

TABLE 2

| | | Layer structure | | | | Surface diffusion |
|---|---|---|---|---|---|---|
| | | 1st | 2nd | 3rd | Pad layer | inhibiting surface |
| Example 1 | p layer | NiRhAu | Ti/TiN/Ti | TiPtAuTi | TiPtAu/SAC | Present |
| | n layer | TiAlTi | TiPtAuTi | — | | |
| Example 2 | p layer | NiRhAu | Ti/TiN/Ti | — | TiPtAu/SAC | Present |
| | n layer | TiAlTi | Ti/TiN/Ti | — | | |
| Comparative Example 1 | p layer | NiRhAu | PtAuTi | TiPtAuTi | TiPtAu/SAC | Present |
| | n layer | TiAlTi | TiPtAuTi | — | | |
| Comparative Example 2 | p layer | NiRhAu | Ti/TiN/Ti | TiPtAuTi | TiPtAu/SAC | Absent |
| | n layer | TiAlTi | TiPtAuTi | — | | |

(Evaluation)

For the light-emitting devices (number of elements subjected to measurements: 24) obtained in Examples 1, 2 and Comparative Examples 1, 2; the light output power and the forward voltage (Vf) were measured when a 600 mA current was passed using a constant current/voltage power supply, and the average values were determined. FIG. 8 presents a table of the results of the measurements.

Further, from the light-emitting devices of each of Examples 1, 2 and Comparative Examples 1, 2; light-emitting devices having a forward voltage close to the average forward voltage were selected as representatives; and the selected light-emitting devices were heated on a hot plate at 290 °C for 3 min, followed by an observation of the electrode appearance using a metallurgical microscope, thereby determining the light output power. Further, excluding the light-emitting devices of Comparative Example 1 where changes were found after the heating at 290 °C for 3 min; the light-emitting devices of Examples 1, 2 and Comparative Example 2 where no change was observed at 290 °C were additionally subjected to heating at a higher temperature of 320 °C for 3 min, and the electrode appearance and the light output power were observed. Optical micrographs (OMs) of the electrode appearance of the light-emitting devices of Comparative Example 1 having been subjected to heating at 290 °C and the light-emitting devices of Examples 1, 2 and Comparative Example 2 having been heated to 320 °C; micrographs overview images of the light-emitting devices; and observations about the overview images of the light-emitting devices (states after heating) are given all together in the table of FIG. 8.

In Examples 1 and 2, no changes were observed in the appearance of the electrodes at both 290 °C and 320 °C. Further, the light output power did not change, either.

Although photographs of the electrode appearance and an overview image of the light-emitting devices of Examples 3 and 4 are not given, no anomalies were found in the appearance of the electrodes at both 290 °C and 320 °C as in Examples 1 and 2. Further, the light output power did not change, either.

In Comparative Example 1, anomalies were found in the appearance of the electrode at a point after heating at 290 °C for 3 min; discoloration was found in the pad portion. The discoloration may have been due to diffusion of Ag contained in the joint material into the p-type ohmic electrode through the pad portion.

In Comparative Example 2, both after heating at 290 °C for 3 min and after heating at 320 °C for 3 min, no anomalies were found in the appearance of the electrode. However, after heating at 320 °C, some chips stopped emitting light although a current was supplied. Since no change was found in the appearance, Ag contained in the joint material conceivably did not migrate through the barrier layer. However, it may have been that migration causing Ag contained in the join material to reach the side surface of the barrier layer through the Pt-containing layer from the pad portion due to heat occurred and then Ag reached the side surface of the light emitting layer through the side surface of the barrier layer, resulting in a short circuit between the p-type layer and the n-type layer, thus the emission stopped.

Note that the migration of Ag which may cause emission failure (short circuit) was not inhibited in Comparative Example 2 probably due to the relationship between the thickness of the barrier layer and the shortest width of the surface diffusion inhibiting surface. Specifically, in Comparative Example 2, a distance corresponding to the thickness of an end portion of the TiN layer in the barrier layer (1 μm) may have been a distance, that Ag could not migrate through the inside of barrier layer, but Ag could migrate along the surface (side surface) of the barrier layer. Accordingly, the surface diffusion inhibiting surface preferably has the shortest width larger than the thickness of the barrier layer.

The above evaluations demonstrated that a p-type electrode that could suppress detrimental effects such as discoloration of electrodes and emission failure by forming a barrier layer including a TIN layer with a surface diffusion inhibiting surface S being reserved.

Thus, this disclosure provides a semiconductor light-emitting device and a method of producing a semiconductor light-emitting device for which detrimental effects such as discoloration of an electrode or emission failure due to migration are suppressed even when a joint material containing Ag is used.

It should be noted that the structures disclosed in the above embodiments (hereinafter including other embodiments) can be applied in combination with structures disclosed in other embodiments unless inconsistencies occur. Further, the embodiments disclosed in this specification are merely illustrative, and embodiments of the present invention are not limited to those and can be modified as appropriate without departing from the spirit of the present invention.

INDUSTRIAL APPLICABILITY

The present disclosure can be applied to a semiconductor light-emitting device, a semiconductor light-emitting device connecting structure, and a method of producing a semiconductor light-emitting device.

REFERENCE SIGNS LIST

2: p-type electrode
3: Pt-containing layer
4: Pad
**4*a***: Pad portion
5: Joint material
6: Protective film
10: Substrate
11: n-type semiconductor layer
**11*a***: n-type layer protective film formation region
12: Light emitting layer
13: p-type semiconductor layer
21: Ohmic metal layer
22: Barrier layer
91: n-type ohmic electrode
92: Pt-containing layer
93: Barrier layer
94: n-side pad
**94*a***: n-side pad portion
95: Joint material
100: Light-emitting device (semiconductor light-emitting device)
100A: Light-emitting device
221: First Ti layer
222: TiN layer
223: Second Ti layer
S: Surface diffusion inhibiting surface
w: Shortest width

The invention claimed is:

1. A semiconductor light-emitting device comprising:
a p-type AlGaN-based semiconductor layer;
a p-type electrode provided on the p-type AlGaN-based semiconductor layer;
an insulating protective film on the p-type electrode; and
a pad provided on the p-type electrode,
wherein the p-type electrode includes:
an ohmic metal layer placed on a p-type AlGaN-based semiconductor layer side; and
a barrier layer that is placed closer to the pad than the ohmic metal layer and contains a TiN layer, and
wherein when a region of the barrier layer that does not overlap an electrical connection region between the pad and the barrier layer in a top view is defined as a surface diffusion inhibiting surface, the surface diffusion inhibiting surface is formed in a ring-shaped pattern,
wherein the barrier layer further includes a Ti layer, and
wherein a first part of a top surface of the Ti layer on a pad side forms the surface diffusion inhibiting surface and is directly covered by the insulating protective film.

2. The semiconductor light-emitting device according to claim 1, wherein the ohmic metal layer is a layer free of Ag.

3. The semiconductor light-emitting device according to claim 1, wherein in a top view, a region of the barrier layer is completely overlapped with or is included in a region of the ohmic metal layer.

4. The semiconductor light-emitting device according to claim 1, wherein a thickness of the TiN layer included in the barrier layer is 100 nm or more and 2000 nm or less.

5. The semiconductor light-emitting device according to claim 1, wherein the ohmic metal layer contains Ni and Au.

6. The semiconductor light-emitting device according to claim 1, wherein in a top view, a shortest distance between an outer periphery of the electrical connection region and an outer periphery of the region of the barrier layer is 3 μm to 50 μm.

7. The semiconductor light-emitting device according to claim 1, wherein the barrier layer inhibits migration of Ag through the pad into the p-type AlGaN-based semiconductor layer.

8. The semiconductor light-emitting device according to claim 1, wherein a second part of the top surface of the Ti layer, different from the first part, is in direct contact with the pad to form the electrical connection region.

9. A semiconductor light-emitting device connecting structure comprising a joint material containing Ag and the semiconductor light-emitting device according to claim 1,
- wherein the joint material is formed on the pad of the semiconductor light-emitting device.

10. A semiconductor light-emitting device comprising:
- a p-type AlGaN-based semiconductor layer;
- a p-type electrode provided on the p-type AlGaN-based semiconductor layer; and
- a pad provided on the p-type electrode,
- wherein the p-type electrode includes:
  - an ohmic metal layer placed on a p-type AlGaN-based semiconductor layer side; and
  - a barrier layer that is placed closer to the pad than the ohmic metal layer and contains a TiN layer, and
- wherein when a region of the barrier layer that does not overlap an electrical connection region between the pad and the barrier layer in a top view is defined as a surface diffusion inhibiting surface, the surface diffusion inhibiting surface is formed in a ring-shaped pattern,
- wherein the barrier layer further includes a Ti layer,
- wherein a first part of a top surface of the Ti layer on a pad side forms the surface diffusion inhibiting surface, and
- wherein a second part of the top surface of the Ti layer, different from the first part, is in direct contact with the pad to form the electrical connection region.

11. The semiconductor light-emitting device according to claim 10, wherein the ohmic metal layer is a layer free of Ag.

12. The semiconductor light-emitting device according to claim 10, wherein in a top view, a region of the barrier layer is completely overlapped with or is included in a region of the ohmic metal layer.

13. The semiconductor light-emitting device according to claim 10, wherein a thickness of the TiN layer included in the barrier layer is 100 nm or more and 2000 nm or less.

14. The semiconductor light-emitting device according to claim 10, wherein the ohmic metal layer contains Ni and Au.

15. The semiconductor light-emitting device according to claim 10, wherein in a top view, a shortest distance between an outer periphery of the electrical connection region and an outer periphery of the region of the barrier layer is 3 μm to 50 μm.

16. The semiconductor light-emitting device according to claim 10, wherein the barrier layer inhibits migration of Ag through the pad into the p-type AlGaN-based semiconductor layer.

17. A method of producing a semiconductor light-emitting device, the method comprising:
- a p-type electrode formation step of forming a p-type electrode on a p-type AlGaN-based semiconductor layer;
- an insulating protective film formation step of forming an insulating protective film on the p-type electrode; and
- a pad formation step of forming a pad on the p-type electrode,
- wherein the p-type electrode formation step includes:
  - an ohmic metal layer formation step of forming an ohmic metal layer on a p-type AlGaN-based semiconductor layer side; and
  - a barrier layer formation step of forming a barrier layer including a TiN layer closer to the pad than the ohmic metal layer,
- wherein when a region of the barrier layer that does not overlap an electrical connection region between the pad and the barrier layer in a top view is defined as a surface diffusion inhibiting surface, the pad is formed such that the surface diffusion inhibiting surface is formed in a ring-shaped pattern in the pad formation step,
- wherein the barrier layer formation step includes forming the barrier layer including the TiN layer and a Ti layer, and
- wherein the insulating protective film formation step includes forming the insulating protective film to directly cover a first part of a surface of the Ti layer on a pad side, such that the first part forms the surface diffusion inhibiting surface.

18. The method of producing a semiconductor light-emitting device, according to claim 17, wherein the ohmic metal layer formed in the ohmic metal layer formation step does not contain Ag.

19. The method of producing a semiconductor light-emitting device, according to claim 17, wherein a region of the barrier layer is completely overlapped with or is included in the region of the ohmic metal layer in a top view in the barrier layer formation step.

* * * * *